United States Patent
Joo et al.

(10) Patent No.: US 8,168,997 B2
(45) Date of Patent: May 1, 2012

(54) LIGHT EMITTING DIODE PACKAGE

(75) Inventors: Seong Ah Joo, Gyeonggi-do (KR); Jung Kyu Park, Seoul (KR); Kun Yoo Ko, Gyeonggi-do (KR); Young June Jeong, Seoul (KR); Seung Hwan Choi, Gyeonggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 348 days.

(21) Appl. No.: 12/192,175

(22) Filed: Aug. 15, 2008

(65) Prior Publication Data

US 2009/0050923 A1    Feb. 26, 2009

(30) Foreign Application Priority Data

Aug. 21, 2007  (KR) .................. 10-2007-0083886

(51) Int. Cl.
*H01L 33/00* (2010.01)
(52) U.S. Cl. ............ 257/99; 257/79; 257/706; 257/707; 257/E33.056; 257/E33.057
(58) Field of Classification Search .................... 257/99, 257/706, 707, E33.056, E33.057, 79
See application file for complete search history.

(56) References Cited

U.S. PATENT DOCUMENTS

| | | | |
|---|---|---|---|
| 6,480,389 B1 * | 11/2002 | Shie et al. ...................... 361/707 |
| 2005/0280017 A1 * | 12/2005 | Oshio et al. ...................... 257/99 |
| 2006/0030063 A1 * | 2/2006 | Wang et al. ...................... 438/22 |
| 2006/0131708 A1 * | 6/2006 | Ng et al. ........................ 257/678 |
| 2006/0202210 A1 * | 9/2006 | Mok et al. ........................ 257/79 |
| 2007/0096129 A1 | 5/2007 | Park |
| 2007/0096271 A1 * | 5/2007 | Takahashi ..................... 257/669 |
| 2007/0096272 A1 * | 5/2007 | Wang ............................. 257/675 |
| 2009/0108281 A1 * | 4/2009 | Keller et al. ..................... 257/98 |
| 2010/0252851 A1 * | 10/2010 | Emerson et al. ................. 257/98 |

FOREIGN PATENT DOCUMENTS

KR  10-2006-0105225    10/2006
KR  10-0641889          10/2006

* cited by examiner

*Primary Examiner* — Long Tran
(74) *Attorney, Agent, or Firm* — McDermott Will & Emery LLP

(57) ABSTRACT

Provided is an LED package including a printed circuit board (PCB); a conductive structure that is formed on the PCB and is composed of any one selected from a silicon structure and an aluminum structure; and an LED chip that is mounted on the PCB and is electrically connected to the PCB through the conductive structure.

5 Claims, 1 Drawing Sheet

[DRAWINGS]
[FIG. 1]
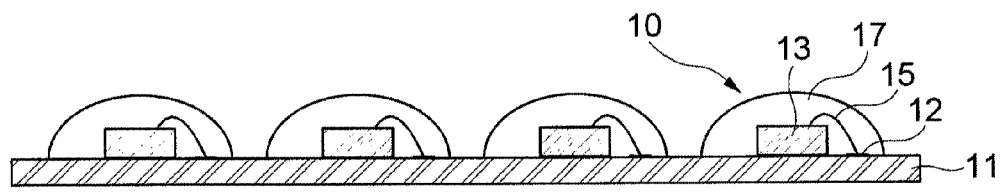
- Prior Art
[FIG. 2]
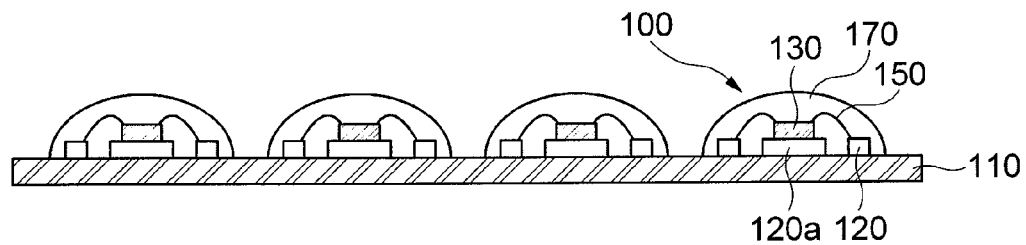

LIGHT EMITTING DIODE PACKAGE

CROSS-REFERENCE TO RELATED APPLICATIONS

This application claims the benefit of Korean Patent Application No. 10-2007-0083886 filed with the Korea Intellectual Property Office on Aug. 21, 2007, the disclosure of which is incorporated herein by reference.

BACKGROUND OF THE INVENTION

1. Field of the Invention

The present invention relates to a light emitting diode (LED) package, and more specifically, to a chip-on-board (COB) LED package which can reduce a manufacturing cost.

2. Description of the Related Art

LED is a semiconductor element which converts electric energy into light energy and is composed of a compound semiconductor which emits a specific wavelength of light depending on an energy bandgap. LED is used in optical communication, display (mobile display, computer monitor), backlight unit (BLU) for LCD and so on.

When LED is used for a mobile display and a computer monitor, a light source is positioned on one surface of a screen, and light is uniformly distributed through a light guide plate. Therefore, the number of LED chips to be used is small.

On the other hand, when LED is used as a backlight source for large-sized TVs, a light source should be disposed under the screen. Therefore, the number of LED chips to be used increases, compared with when the light source is positioned on one surface of the screen. In general, several hundreds to several thousands of LED chips are used. In this case, a COB method is used, in which several hundreds to several thousands of LED packages are mounted on a substrate, or LED chips are directly mounted on a printed circuit board (PCB).

FIG. 1 is a cross-sectional view of a conventional LED package serving as a backlight source, in which LED chips are directly mounted on a PCB.

As shown in FIG. 1, the conventional LED package 10 includes a PCB 11 and a plurality of LED chips 13 mounted on the PCB 11.

On the PCB 11, a plurality of electrode pads 12 are formed so as to be electrically connected to the LED chips 13 through wires 15. The electrode pad 12 is formed of Au (gold) or Ag (silver).

On the LED chip 13, a molding compound 17 is formed so as to protect the LED chip 13 and the wire 15.

The conventional LED package 10 constructed in such a manner generates light by using an electrical signal supplied through the PCB 11.

In the conventional LED package 10, however, the electrode pads 12 formed on the PCB 11 are formed of a metallic material such as Au or Ag, and the number of LED chips 13 mounted on the PCB 11 reaches several hundreds to several thousands. Therefore, the number of electrode pads 12 which are to be formed in accordance with the number of LED chips 13 inevitably increases, thereby increasing the manufacturing cost.

Further, since the heat generated from the LED chips is not effectively radiated, the brightness of the LED chips decreases, and thus the lifespan thereof decreases.

SUMMARY OF THE INVENTION

An advantage of the present invention is that it provides an LED package in which conductive structures formed of silicon are mounted on a PCB, instead of electrode pads formed of Au or Ag, which makes it possible to reduce the manufacturing cost.

Additional aspects and advantages of the present general inventive concept will be set forth in part in the description which follows and, in part, will be obvious from the description, or may be learned by practice of the general inventive concept.

According to an aspect of the invention, an LED package comprises a printed circuit board (PCB); a conductive structure that is formed on the PCB and is composed of any one selected from a silicon structure and an aluminum structure; and an LED chip that is mounted on the PCB and is electrically connected to the PCB through the conductive structure.

The conductive structure may have a thickness of several hundred μm.

The LED chip may be connected to the conductive structure through wire bonding.

The LED package further comprises a conductive adhesive layer for mounting the LED chip on the surface of the conductive structure.

The LED package further comprises a molding compound that packages the conductive structure and the LED chip.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view of a conventional LED package serving as a backlight source, in which LED chips are directly mounted on a PCB; and FIG. 2 is a cross-sectional view of an LED package according to an embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, an LED package and a method of manufacturing the same according to the present invention will be described in detail with reference to the accompanying drawings.

FIG. 2 is a cross-sectional view of an LED package according to an embodiment of the invention.

As shown in FIG. 2, the LED package 100 according to the embodiment of the invention includes a PCB 110, an LED chip 130 mounted on the PCB 110, and a plurality of conductive structures 120 and 120a which electrically connect the PCB 110 to the LED chips 130.

The PCB 110 is a metal PCB in which a flexible PCB formed of polyimide is attached to the top surface of a heat radiating body formed of metal with high heat conductivity through an adhesive so as to enhance heat radiation performance. The LED chip 130 is directly mounted on the top surface of the flexible PCB and is connected to the conductive structures 120 formed on the top surface of the flexible PCB through a wire 150 so as to receive a current.

Alternatively, the PCB 110 may be a PCB formed of resin, on which an electrode circuit for electrically connecting the LED chip 130 is formed. The PCB formed of resin may have a heat radiating body attached to the bottom surface thereof.

Although not shown, the LED chip 130 includes a light emission structure, in which an n-type semiconductor layer, an active layer, and a p-type semiconductor layer are sequentially laminated, and n- and p-electrodes which supply electrons and holes to the n-type semiconductor layer and the p-type semiconductor layer, respectively.

To prevent the damage of the LED chip caused by electrostatic discharge (ESD) occurring during the process, the LED chip 130 may further include an ESD prevention circuit such as a Zener diode.

The conductive structures 120 are formed on the PCB 110 so as to be connected to the electrode circuit within the PCB 110, and are electrically connected to the terminals (the n- and p-electrodes) of the LED chip 130, respectively, through the wire 150.

The conductive structures 120 and 120a are formed of a silicon or aluminum structure and has a thickness of several hundred μm.

The conductive structure 120a attached to the bottom surface of the LED chip 130 is electrically connected to the ESD prevention circuit (Zener diode) formed in the LED chip 130 so as to serve as a ground terminal.

The LED chip 130 may be fixed to the top surface of the conductive structure 120a through a conductive adhesive such as Ag epoxy or eutectic solder.

On the LED chip 130, a molding compound 170 is formed so as to package the LED chip 130 and the wire 150. The molding compound 170 is formed of solid transparent resin such as silicon resin, epoxy resin, or synthetic resin.

In the LED package constructed in such a manner, since the silicon structure or aluminum structure is used as the electrode pattern for electrically connecting the terminals of the LED chip to the PCB, it is possible to reduce a material cost, compared with in the related art.

In the related art, a metallic material such as Au or Ag is plated on a PCB so as to form an electrode pattern, and the electrode pattern is electrically connected to terminals of an LED chip through a wire. However, since the number of LED chips which are to be mounted on the PCB so as to be used as a light source of a backlight reaches several hundreds to several thousands, the number of electrode pads which are to be formed in accordance with the number of LED chips inevitably increases. Therefore, the manufacturing cost increases. In the present invention, however, since the silicon or aluminum structure which is cheaper than Au or Ag is used as the electrode pad of the PCB, it is possible to reduce the manufacturing cost, compared with in the related art.

Further, the LED package according to the invention exhibits more excellent heat radiation performance than the conventional LED package.

That is, the electrode pad of the PCB used in the conventional LED package is formed by plating the terminals of the PCB with a metallic material such as Au or Ag, and the thickness of the electrode pad is no more than several tens Å. On the other hand, the conductive structure, which is used in the present invention and is formed of silicon or aluminum, has a thickness of several hundreds μm. Therefore, it is possible to more effectively radiate heat generated from the LED chip than in the related art.

In the LED package according to the invention, as the conductive structure composed of silicon or aluminum is formed as an electrode pad on the PCB, a material cost for forming the electrode pad can be reduced, and the heat radiation effect can be further enhanced. All LED packages in which a silicon or aluminum structure is formed as an electrode pad of a PCB are included in the present invention, regardless of the type of the PCB and LED chips.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A light emitting diode (LED) package comprising:
    a printed circuit board (PCB);
    a first conductive structure;
    a second conductive structure comprising at least two separated parts separate from the first conductive structure, wherein the first conductive structure and the second conductive structure are attached to the PCB; and
    an LED chip that is mounted on the first conductive structure and is electrically connected to the PCB through the second conductive structure, the LED chip has an n-electrode and a p-electrode, wherein the first conductive structure being attached to the bottom surface of the LED chip, and wherein the at least two separated parts of the second conductive structure are connected to the n-electrode and the p-electrode of the LED chip.

2. The LED package according to claim 1, wherein the LED chip is connected to the second conductive structure through wire bonding.

3. The LED package according to claim 1 further comprising:
    a molding compound that packages the first and the second conductive structures and the LED chip.

4. The LED package according to claim 1, wherein the first and the second conductive structures are composed of a silicon or aluminum structure.

5. The LED package according to claim 1, wherein the first and the second conductive structures are made of a common material.

* * * * *